United States Patent

Furuta

Patent Number: 5,550,491
Date of Patent: Aug. 27, 1996

[54] CURRENT-MODE LOGIC CIRCUIT

[75] Inventor: Koichiro Furuta, Tokyo, Japan

[73] Assignee: NEC Corporation, Japan

[21] Appl. No.: 531,931

[22] Filed: Sep. 21, 1995

[30] Foreign Application Priority Data

Sep. 28, 1994 [JP] Japan .................. 6-233491

[51] Int. Cl.$^6$ .................................. H03K 19/20
[52] U.S. Cl. ........................... 326/115; 326/112
[58] Field of Search ...................... 326/112, 115; 327/51, 52, 65, 94, 96, 103, 109, 127

[56] References Cited

U.S. PATENT DOCUMENTS

| | | | |
|---|---|---|---|
| 4,570,084 | 2/1986 | Griffin | 326/115 |
| 4,808,851 | 2/1989 | Chantepie | 326/115 |
| 4,924,116 | 5/1990 | Vu et al. | 326/115 |
| 4,973,864 | 11/1990 | Nogami | 327/52 |
| 5,149,992 | 9/1992 | Allstot | 326/115 |

OTHER PUBLICATIONS

D. J. Allstot et al., "Analog Logic Techniques Steer Around the Noise", IEEE Circuits & Devices, Sep. 1993, pp. 18–21.

M. Mizuno et al., "A GHz MOS Adaptive Pipeline Technique Using Variable Delay Circuits", IEEE 1994 Symposium on VLSI Circuits Digest of Technical Papers, pp. 27–28.

Primary Examiner—Edward P. Westin
Assistant Examiner—Andrew Sanders
Attorney, Agent, or Firm—Ostrolenk, Faber, Gerb & Soffen, LLP

[57] ABSTRACT

A current-mode logic circuit is provided having large gain and resistance to noise or power source fluctuations which employs in its logic circuits circuits that shape waves. Such a current-mode logic circuit entails little increase in the area of integrated circuits. In addition to a differential logic pair composed of MOS transistors M31 and M32, load elements R31 and R32, and constant-current source I31, the current-mode logic circuit of the present invention is provided with a holding transistor pair composed of MOS transistors M33 and M34. MOS transistors M31 and M32 have equal conductance, and MOS transistors M33 and M34 have equal conductance. In addition, the present invention is characterized in that the sum of conductance of MOS transistors M31 and M33 is a constant if the electrical power consumption of the circuits is constant.

4 Claims, 2 Drawing Sheets

CURRENT-MODE LOGIC CIRCUIT

BACKGROUND OF THE INVENTION

1. Field of the Invention:

The present invention relates to a current-mode logic circuit, and particularly to a current-mode logic circuit made up of a MOS transistor that performs wave shaping.

2. Description of the Related Art:

This type of current-mode logic circuit has conventionally been used for operating logic circuits composed of MOS transistors at low power voltage and high speed.

As an example, FIG. 1 shows a circuit diagram of one type of current-mode logic circuit of the prior art.

This current-mode logic circuit is an inverter/buffer circuit taking MOS transistors M11 and M12 as a differential logic pair. The gate electrode of MOS transistor M11 is connected to input line 11, the source electrode is connected to constant-current power source I11, and the drain electrode is connected to output line 10 and load element R11. The gate electrode of MOS transistor M12 is connected to input line 11B, the source electrode is connected to constant-current power source I11, and the drain electrode is connected to output line 10B and load element R12.

The operation of the current-mode logic circuit will next be explained with reference to FIG. 1. If for example, an input signal and its reverse signal are inputted to current-mode logic circuit from input lines 11 and 11B, respectively, and the input signal of input line 11 changes from high level to low level, MOS transistor M11 switches from a conductive state to a nonconductive state and MOS transistor M12 switches from a nonconductive state to a conductive state, the path of the constant current switches, a voltage drop occurs at load element R12 without a voltage drop occurring at load element R11, the signal of output line 10 changes to high level, and the signal at output line 10B changes to low level.

FIG. 2 shows a circuit diagram of another example of a current-mode logic circuit of the prior art. This current-mode logic circuit selects and outputs one signal from among N input signals. Instead of the differential logic pair composed of MOS transistors M11 and M12 explained in FIG. 1, this current-mode logic circuit has a configuration including a series-parallel connected differential logic pair made up of N sets of MOS transistors M211, M212; M221, M222; . . . M2N1, M2N2 that amplify N sets of input signals and their reverse signals inputted to N sets of input lines 211, 211B; 221, 221B; . . . 2N1, 2N1B; and NMOS transistors M213, M223, . . . M2N3 having gate electrodes connected to N input lines 213, 223, . . . 2N3, respectively, that select whether or not current is to be supplied to the N sets of MOS transistors.

If the electrical power consumption of the circuit of FIG. 2 is designed to be the same as the electrical power consumption of the circuit of FIG. 1, the values of constant-current source I21 as well as load elements R21 and R22 are identical to the values of constant-current source I11 as well as the load elements R11 and R12 of FIG. 1.

The operation of this current-mode logic circuit will next be explained with reference to FIG. 2. For example, if only the input signal of input line 213 among the N input lines 213, 223, . . . , 2N3 of this current-mode logic circuit is of high level, current is supplied only to MOS transistors M211 and M212, and consequently, the signals of input lines 211 and 211B are amplified and output signals are outputted to output lines 20 and 20B.

In the case of the current-mode logic circuit composed of MOS transistors according to the above-described prior art, in cases where the amplitude of an output signal is decreased through noise due to logic circuit switching, power voltage fluctuation, or changes in manufacturing processes, logic circuit designers have been compelled to supplement circuits by increasing the number of gate wafer sections (the number of logic circuit wafer sections) concatenating to shape the wave of output signals, or increase the transistor dimensions to increase gain of each individual gate (individual logic circuit). Consequently, when designing integrated circuits having large gain and resistance to the influence of noise or power source fluctuations, because integrated circuit density dropped within the same area, logic circuit designers found it necessary to shift other necessary functions to separate integrated circuits. This has resulted in a trend toward integrated circuits of increased area and increased cost.

SUMMARY OF THE INVENTION

Accordingly, the object of the present invention is to provide a current-mode logic circuit involving limited increase in the integrated circuit area and employing in the logic circuit a circuit that performs wave shaping with large gain and strong resistance to influence by noise or power fluctuations.

A current-mode logic circuit according to the present invention therefore comprises a differential logic pair that is composed of a first logic means for controlling conductive or nonconductive states between a first output line and a constant-current source by means of an input signal or its reverse signal and a second logic means for controlling the conductive or nonconductive states between a second output line and the constant-current source by means of the input signal or its reverse signal, equivalent conductance of the first and second logic means being equal, and, in response to the input signal or its reverse signal, the conductive or nonconductive states of the first and second logic means acting with complementary logic;

and includes a holding transistor pair composed of a first MOS transistor having its gate electrode connected to the second output line, its drain electrode connected to the first output line, and its source electrode connected to the constant-current source, and a second MOS transistor having its gate electrode connected to the first output line, its drain electrode connected to the second output line, and its source electrode connected to the constant-current source; the first and second MOS transistors having equal conductance.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 3:
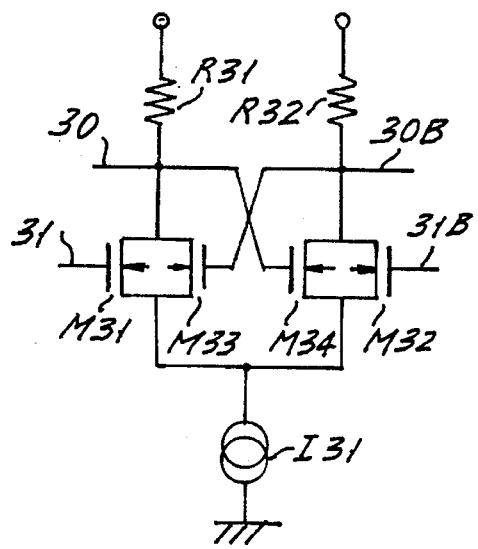
FIG. 3 is a circuit diagram showing the first embodiment of a current-mode logic circuit according to the present invention.

Embodiments of the present invention will next be explained with reference to the figures. FIG. 3 is a circuit diagram showing the first embodiment of a current-mode logic circuit according to the present invention. Referring to FIG. 3, the current-mode logic circuit of this embodiment is an inverter/buffer circuit which takes MOS transistors M31 and M32 as a differential logic pair, MOS transistor M31 having its gate electrode connected to input line 31, its source electrode connected to constant-current source I31, and its drain electrode connected to output line 30 and load element R31. MOS transistor M32 has its gate electrode connected to input line 31B, its source electrode connected to constant-current source I31, and its drain electrode connected to output line 30B and load element R32.

This current-mode logic circuit furthermore includes a holding transistor pair composed of MOS transistors M33 and M34. MOS transistor M33 has its gate electrode connected to output line 30B, its source electrode connected to constant-current source I31, and its drain electrode connected to output line 30. MOS transistor M34 has its gate electrode connected to output line 30, its source electrode connected to constant-current source I31, and its drain electrode connected to output line 30B.

This current-mode logic circuit is characterized in that MOS transistors M31 and M32 making up the differential logic pair have equal conductance, and MOS transistors M33 and M34 making up the holding transistor pair also have equal conductance.

In addition, constant-current source I31 is made up of a field-effect transistors such as MOS transistors, bipolar transistors, and a combination of the resistance elements of these transistors, and load elements R31 and R32 are composed of, for example, diffusion layers, polycrystal silicon, and transistors.

The operation of the first embodiment of the current-mode logic circuit according to the present invention will next be explained with reference to FIG. 3. In the current-mode logic circuit of the present embodiment, when for example, an input signal and its reverse signal are inputted to input lines 31 and 31B, respectively, and the input signal of input line 31 changes from high level to low level, MOS transistor M31 then changes from a conductive state to a nonconductive state and MOS transistor M32 changes from a nonconductive state to a conductive state, thereby switching the constant current path; a voltage drop occurs at load element R32 without the occurrence of a voltage drop at load element R31; and the signal of output line 30 changes to high level and the signal of output line 30B changes to low level.

At this time, because the signals of output line 30B and output line 30 are inputted to the gate electrodes, MOS transistors M33 and M34 of the holding transistor pair become conductive or nonconductive after MOS transistors M31 or M32 of the differential logic pair, and the change in potentials of the output signals of output line 30 and output line 30B connected to the drain electrodes is therefore accelerated, the input/output gain of the current-mode logic circuit increased, and shaping of its output wave enabled.

If the electrical power consumption of this current-mode logic circuit is made a constant value, the sum of the equivalent conductance of the differential logic pair between the output line and the constant-current source and the conductance of the holding transistor pair will be a constant value, the input/output gain of this current-mode logic circuit will increase in proportion to the conductance of the holding transistor pair, shaping of the output wave will be enabled, and increase in the area of the integrated circuit due to addition of the holding transistor pair will be suppressed.

Figure 1:
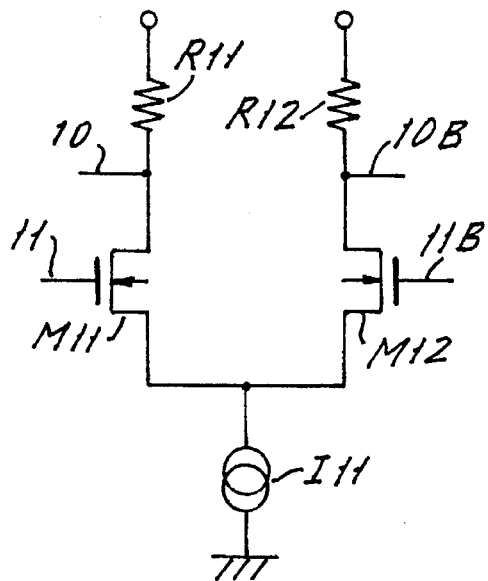
FIG. 1 is a circuit diagram showing one example of a current-mode logic circuit according to the prior art.

For example, if the electrical power consumption of this current-mode logic circuit is identical to the electrical power consumption of the prior-art current-mode logic circuit shown in FIG. 1, the values of constant-current source I31 as well as load elements R31 and R32 will be identical to the values of constant-current source I11 as well as load elements R11 and R12 of FIG. 1. In addition, the sum of the conductance of MOS transistor M31 and M33 will be equal to the conductance of M11 of FIG. 1. If channel length is fixed, the conductance of the MOS transistors is proportional to channel width, and therefore, the sum of the transistor areas of MOS transistors M31 and M33 will be equal to the transistor area of M11 of FIG. 1, and there will be no increase in transistor area due to the addition of the holding transistor pair.

Furthermore, in this current-mode logic circuit, if the conductance of the holding transistor pair between the output lines and the constant-current source becomes greater than the equivalent conductance of the differential logic pair, the input/output characteristic of this current-mode logic circuit will have a hysteresis characteristic that depends on the conductance of the holding transistor pair. This is because the driving current of the holding transistor pair becomes greater than the driving current of the differential logic pair, and a large input voltage is required to reverse the output potential. By using this type of circuit configuration, the present invention limits increase in circuit area and enables a current-mode logic circuit having strong resistance to the effects of noise. To achieve the same capabilities as the present invention, the prior-art current-mode logic circuit of FIG. 1 has been provided with additional gate circuit sections, thereby increasing the area of the integrated circuits of the logic circuits.

Figure 4:
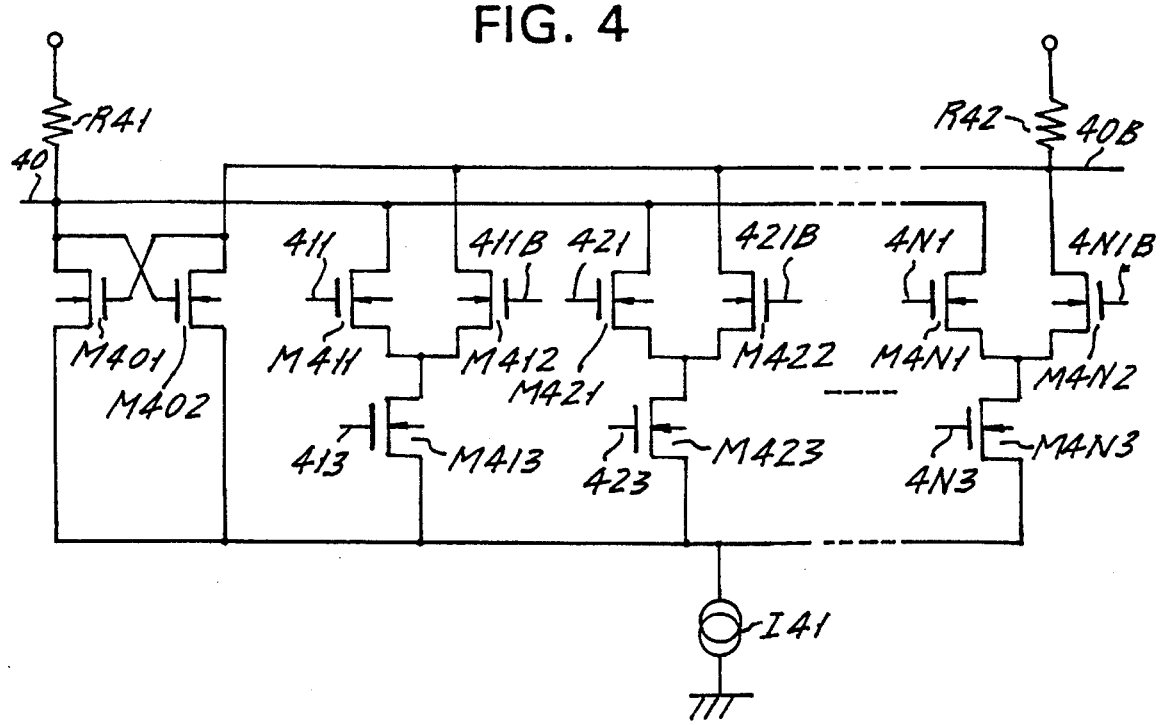
FIG. 4 is a circuit diagram showing the second embodiment of a current-mode logic circuit according to the present invention.

FIG. 4 is a circuit diagram showing the second embodiment of a current-mode logic circuit of the present invention. As shown in the figure, this current-mode logic circuit is a circuit in which one signal is selected and outputted from among N input signals. Instead of the differential logic pair composed of MOS transistors M31 and M32 shown in FIG. 3, this current-mode logic circuit has a configuration that includes a series-parallel connected differential logic pair made up of N sets of MOS transistors M411, M412; M421, M422; . . . M4N1, M4N2 that amplify N sets of input signals and their reverse signals inputted to N sets of input lines 411, 411B; 421, 421B; . . . 4N1, 4N1B; respectively; and NMOS transistors M413, M423, . . . M4N3 having gate electrodes connected to N input lines 413, 423, . . . 4N3, respectively, that select whether or not current is to be supplied to the N sets of MOS transistors.

If this current-mode logic circuit is designed such that its electrical power consumption is equal to the electrical power consumption of the current-mode logic circuit of FIG. 3, the values of constant-current source I41 as well as load elements R41 and R42 will be identical to the values of constant-current source I31 as well as load elements R31 and R32, respectively, of FIG. 3. Similarly, the holding transistor pair made up of MOS transistors M401 and M402 will have the same conductance as the holding transistor pair made up of MOS transistors M33 and M34 in FIG. 3.

This current-mode logic circuit is characterized in that, if electrical power consumption is constant, the sum of the conductance of the holding transistor pair and the equivalent conductance of the series-parallel connected differential logic pair will also be constant, the differential logic pair being made up of MOS transistors M411, M412; M421, M422; . . . M4N1, M4N2; and MOS transistors M413, M423, . . . M4N3 between output line 40 and constant-current source I41 and between output line 40B and constant-current source I41.

The operation of the current-mode logic circuit according to the second embodiment of the present invention will next be briefly explained with reference to FIG. 4. For example, if among N input lines 413, 423, . . . 4N3, only the input signal of input line 413 is high level, current is supplied only to MOS transistors M411 and M412, and consequently, the input signal of input lines 411 and 411B is amplified and outputted to output lines 40 and 40B. At this time, the operation of the holding transistor pair made up of MOS transistors M401 and M402 is identical to that of the holding transistor pair made up of M33 and M34 in FIG. 3, and the same characteristic is exhibited as for the current-mode logic circuit according to the first embodiment of the present invention of FIG. 3.

In particular, if the series-parallel connected differential logic pair is large, as in the present embodiment, the condition that the sum of the equivalent conductance of the differential logic pair between the output line and the constant-current source added to the conductance of the holding transistor pair is constant gives rise to a remarkable effect in circuit area, even resulting in a reduction of circuit area from that of an individual prior-art circuit lacking a holding transistor pair.

Figure 2:
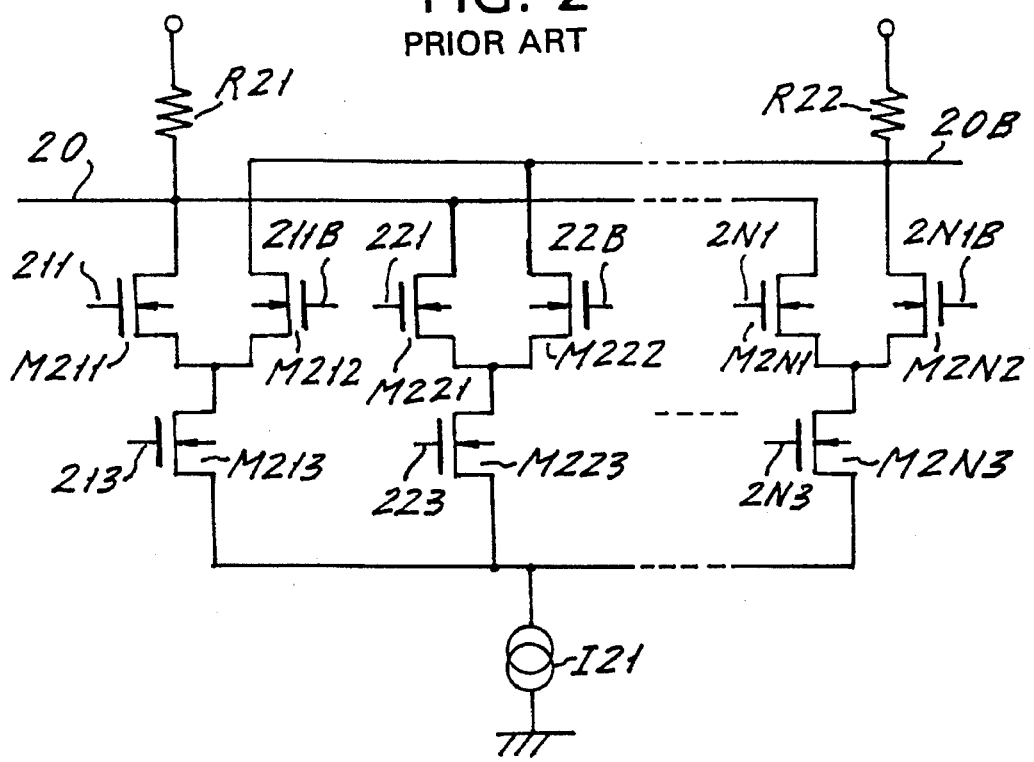
FIG. 2 is a circuit diagram showing another example of a current-mode logic circuit according to the prior art.

Generally, if two MOS transistors are connected in a series and the conductance is constant, the channel width of the MOS transistors and the transistor area both double, and as a result, the area occupied by the differential logic pair within the entire structure is relatively great when there are many MOS transistors in the differential logic pair, as in the prior-art current-mode logic circuit shown in FIG. 2.

If, for example, the proportion of the conductance of the holding transistor pair in this embodiment is 40%, the conductance of the differential logic pair becomes 60%. Compared with the integrated circuit area of the logic circuit in FIG. 2, the differential logic pair in the present embodiment occupies 60% of the area, and relative to the 40% increase in area for the two transistors in the holding transistor pair, there is a 40% reduction in area for the 3N transistors in the differential logic pair, which is twice as large. The present invention thus affords a great reduction in the area of the overall logic circuit.

Furthermore, the above-described embodiment employs a current-mode logic circuit that selects and outputs one signal from among N input signals, but by series-parallel connecting differential logic pairs, the logic circuit designer can realize a current-mode logic circuit according to the present invention that executes the logic of, for example, a NAND/AND circuit, a NOR/OR circuit, a summing circuit, or a latch circuit. In addition, the logic circuit designer may work the invention using other field-effect transistors in place of MOS transistors.

As described hereinabove, the current-mode logic circuit according to the present invention provides a holding transistor pair to a prior-art current-mode logic circuit having a differential logic pair effected by MOS transistors, thereby enabling an increase in input/output gain and wave shaping to the proportion of the conductance of the holding transistor pair.

In addition, by making the conductance of the holding transistor pair greater than the equivalent conductance of the differential logic pair, the current-mode logic circuit of the present invention attributes a hysteresis characteristic to the input/output characteristic.

Furthermore, if the sum of the conductance of the holding transistor pair added to the equivalent conductance of the differential logic pair between the output line and the constant-current source is a constant, the current-mode logic circuit of the present invention limits the increase in circuit area and enables a logic circuit that is resistant to the effects of noise.

In particular, the effect upon circuit area of the current-mode logic circuit according to the present invention becomes more significant with the increase in size of the differential logic pair, and compared with an individual prior art circuit lacking a holding transistor pair, the circuit configuration of the present invention can even reduce circuit area.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A current-mode logic circuit comprising:

a differential logic pair that is composed of a first logic means for controlling conductive or nonconductive states between a first output line and a constant-current source by means of an input signal or its reverse signal and a second logic means for controlling the conductive or nonconductive states between a second output line and said constant-current source by means of said input signal or its reverse signal; equivalent conductance of said first and second logic means being equal and, in response to said input signal or its reverse signal, conductive or nonconductive states of said first and second logic means acting with complementary logic; and comprising a holding transistor pair that is composed of a first MOS transistor having its gate electrode connected to said second output line, its drain electrode connected to said first output line, and its source electrode connected to said constant-current source, and a second MOS transistor having its gate electrode connected to said first output line, its drain electrode connected to said second output line, and its source electrode connected to said constant-current source; said first and second MOS transistors having equal conductance.

2. A current-mode logic circuit according to claim 1 wherein said first and second logic means are MOS transistors that input to their gate electrodes said input signal or its reverse signal.

3. A current-mode logic circuit according to claim 1 wherein said input signal or its reverse signal is a combination of a plurality of input signals or their reverse signals, and said first and second logic means are series-parallel connected MOS transistors that input to their gate electrodes said plurality of input signals or their reverse signals.

4. A current-mode logic circuit according to claim 1 wherein conductance of said first and second MOS transistors is greater than equivalent conductance of said first and second logic means.

* * * * *